United States Patent
Chanteau

[19]
[11] Patent Number: 6,140,889
[45] Date of Patent: Oct. 31, 2000

[54] HIGH-FREQUENCY SIGNAL SPLITTER

[75] Inventor: Pierre Chanteau, La Haye Malherbe, France

[73] Assignee: U.S. Philips Corporation, New York, N.Y.

[21] Appl. No.: 09/266,328

[22] Filed: Mar. 11, 1999

[30]   Foreign Application Priority Data

Mar. 13, 1998 [FR]   France ................................. 98 03141

[51] Int. Cl.⁷ ..................................................... H03H 7/48
[52] U.S. Cl. ............................................................. 333/131
[58] Field of Search ..................................... 333/119, 131

[56]   References Cited

U.S. PATENT DOCUMENTS

| 3,146,409 | 8/1964 | Lalmond | 333/119 X |
| 3,673,517 | 6/1972 | Ticknor | 333/131 |
| 5,424,695 | 6/1995 | Konishi | 333/131 |

*Primary Examiner*—Paul Gensler
*Attorney, Agent, or Firm*—Steven R. Biren

[57]   ABSTRACT

A splitter for passband signals up to several GHz has symmetrical transformer windings that are connected together at input ends and extend to output ends. An input resistor connects between an input terminal of the splitter and the connected input ends of the windings. A respective output resistor connects between each output end of the windings and a respective output terminal of the splitter. A respective shunt resistor connects between each output end of the windings and ground. A resistor and capacitor in series connect between two of the output ends of the windings.

6 Claims, 1 Drawing Sheet

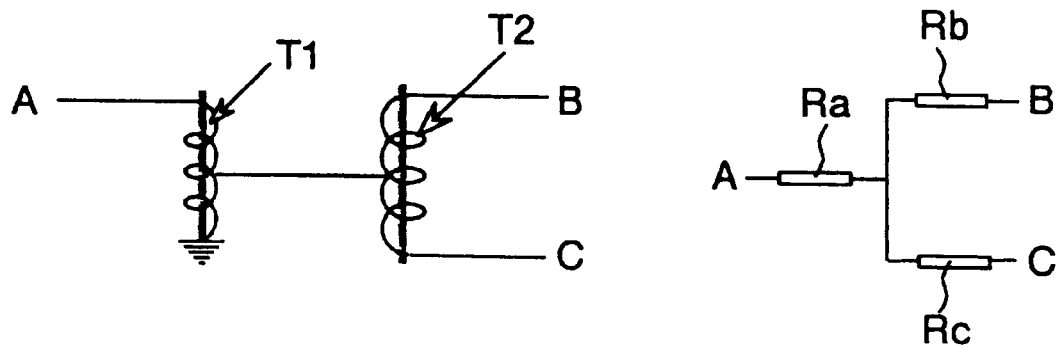
FIG. 1A  PRIOR ART  FIG. 1B
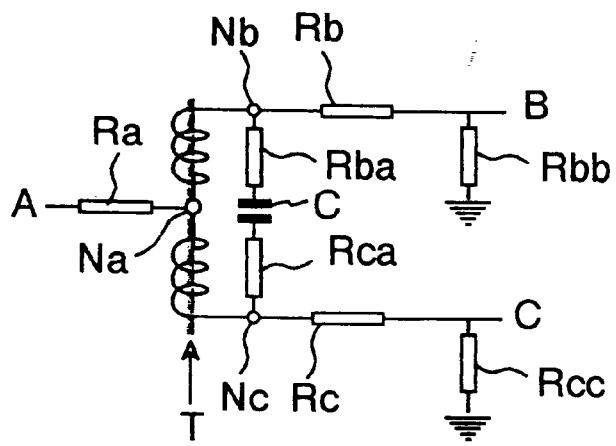
FIG. 2
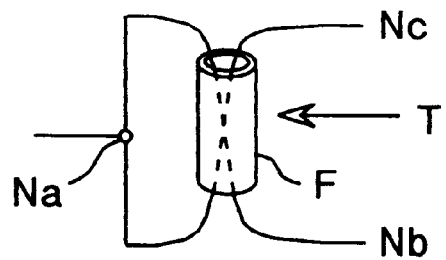
FIG. 3

HIGH-FREQUENCY SIGNAL SPLITTER

FIELD OF THE INVENTION

The invention relates to the field of passband signal splitting using symmetrizing transformers.

BACKGROUND OF THE INVENTION

A splitter for splitting signals of a passband extending of to several GHz, having an input terminal and two output terminals, and including a symmetrizing transformer formed by two symmetrical windings, with an input branch connected to the input terminal of the splitter and two output branches of which each one is connected to an output terminal of the splitter.

A splitter corresponding to the opening paragraph above is known from German patent application DE-OS 24 57 522 hereby incorporated in whole by reference. It relates to a splitter, including a transformer, in branches of which a parallel resistor/capacitor assembly has been added for increasing the isolation for frequencies below 40 MHz, the transition frequency of the resistor/capacitor assembly thus being put at the bottom limit of the television passband, consequently, without any effect in this band over 45 MHz.

SUMMARY OF THE INVENTION

It is an object of the invention to augment the passband upward while ensuring a good isolation of one output with respect to the other and a good impedance matching at the input and output in the whole passband.

For this purpose, the input branch of the symmetrizing transformer is connected to the input terminal of the splitter via a first impedance chosen for being the least reactive possible in the passband, and each of the output branches of the symmetrizing transformer is connected to the corresponding output terminal of the splitter via another impedance chosen for being the least reactive possible in the passband.

The invention is thus based on the idea of combining a resistive device and a symmetrizing transformer device by overlapping each other in some way.

BRIEF DESCRIPTION OF THE DRAWING

These and other more detailed aspects of the invention are apparent from and will be elucidated, by way of non-limiting example, with reference to the embodiments described hereinafter.

FIGS. 1A and 1B illustrate two types of prior-art splitters,

FIG. 2 is a diagram of a splitter according to the invention, and

FIG. 3 illustrates an embodiment of a transformer.

DETAILED DESCRIPTION OF THE PREFERRED EMBODIMENT

A prior-art splitter is illustrated in FIG. 1A. It has an input terminal A and two output terminals B and C and a transformer T1 that matches the line impedance with the input of a second symmetrizing transformer T2. The splitter features little loss, but, in essence, its passband is restricted by the transformers.

Another prior-art splitter is illustrated in FIG. 1B. It includes, connected to an input A, a resistor Ra whose current is divided between two other resistors Rb and Rc to be split up between the two outputs B and C. It is less expensive and less bulky than that of FIG. 1A and it permits a wider passband, but it features more loss and the isolation of an output B with respect to the other output C is only 6 dB.

The high-frequency signal splitter of FIG. 2 has an input terminal A and two output terminals B and C. It includes a symmetrizing transformer T formed by two symmetrical windings connected to each other by a terminal Na which is connected by an input branch to the input A, while each of the other end-terminals Nb or Nc of the symmetrizing transformer is connected by an output branch to one of the output terminals B or C. The splitter also includes in the input branch, an impedance chosen to be the least reactive possible in the passband, here a resistor Ra, and in each of the output branches, an impedance that is the least reactive possible in the passband, here a resistor Rb and Rc, respectively. A resistor in the form of a discrete component, if installed with care, may feature very little parasitic capacitance, that is to say, its impedance is only slightly reactive.

A resistor Rbb is connected between the output B and ground, and a resistor Rcc is connected between the output C and ground.

Between the output Nb of the symmetrizing transformer and its output Nc, a branch is inserted including a resistor Rba connected in series with a capacitor C and with a second resistor Rca. In theory, the two resistors Rba and Rca connected in series could be combined to a single resistor, but still a symmetrical realization is preferred.

Values giving good results are the following: Ra=15 Ω, Rb=Rc=30 Ω, Rbb=Rcc=300 Ω, Rba=Rca=300 Ω, C=82 pF.

FIG. 3 shows a transformer T in which the windings are formed each by a wire half turn connecting Na to Nb and Na to Nc, respectively (these references designate the same objects as in FIG. 2), which run through ferrite tube F.

What is claimed is:

1. A splitter for splitting signals comprising:
    an input terminal and multiple output terminals;
    a symmetrizing transformer formed by symmetrical windings connected together at an input branch and extending to respective output branches, an input impedance connected between the input branch of the symmetrizing transformer and the input terminal of the splitter; and
    a respective output impedance connected between each of the output branches of the symmetrizing transformer and a respective output terminal of the splitter and in which the input and output impedances have low reactance in the passband and are resistors.

2. The splitter of claim 1, further including a resistor between each output terminal and ground.

3. The splitter of claim 1, further including a bypass branch connecting between the output branches of the symmetrizing transformer, the bypass branch including at least one resistor connected in series with a capacitor.

4. The splitter of claim 1, in which the windings of the transformer are each formed by a wire half turn which runs through a common tubular core.

5. The splitter of claim 1, in which there are two output terminals.

6. The splitter of claim 1, in which all the windings of the transformer interact with a common core.

\* \* \* \* \*